(12) United States Patent
Hada et al.

(10) Patent No.: US 7,843,573 B2
(45) Date of Patent: Nov. 30, 2010

(54) COMPONENT SHAPE PROFILING METHOD AND COMPONENT MOUNTING METHOD

(75) Inventors: Junichi Hada, Fukuoka (JP); Eiichi Hachiya, Fukuoka (JP)

(73) Assignee: Panasonic Corporation, Osaka (JP)

( * ) Notice: Subject to any disclaimer, the term of this patent is extended or adjusted under 35 U.S.C. 154(b) by 874 days.

(21) Appl. No.: 11/667,312

(22) PCT Filed: Mar. 7, 2006

(86) PCT No.: PCT/JP2006/004827

§ 371 (c)(1),
(2), (4) Date: May 9, 2007

(87) PCT Pub. No.: WO2006/103901

PCT Pub. Date: Oct. 5, 2006

(65) Prior Publication Data

US 2008/0005900 A1 Jan. 10, 2008

(30) Foreign Application Priority Data

Mar. 29, 2005 (JP) ............................. 2005-096149

(51) Int. Cl.
*G01B 11/24* (2006.01)
(52) U.S. Cl. ...................................... 356/601
(58) Field of Classification Search ................. 356/601; 250/559.222
See application file for complete search history.

(56) References Cited

U.S. PATENT DOCUMENTS

| 6,144,452 A * | 11/2000 | Hachiya ..................... 356/615 |
| 6,195,165 B1 | 2/2001 | Sayegh |
| 6,211,958 B1 * | 4/2001 | Hachiya et al. ............. 382/151 |
| 2004/0119987 A1 | 6/2004 | Madsen et al. |

FOREIGN PATENT DOCUMENTS

JP 2004-235671 8/2004

* cited by examiner

*Primary Examiner*—Roy Punnoose
(74) *Attorney, Agent, or Firm*—Wenderoth, Lind & Ponack, L.L.P.

(57) ABSTRACT

A method for profiling the shape of a component using a line sensor (110) which is provided in a component mounter (100) and which profiles the shape of the component (200) three-dimensionally by (a) projecting a sweeping light onto the component (200) in a relative movement between the line sensor (110) and the component (200) held by a mounting head (103) so that the sweeping light traverses the direction of the movement and (b) detecting the reflected light from the component using a detector (119). The method includes getting the component (200) from the component supply unit 101 using the mounting head (103), rotating the component (200) by a predetermined angle within a predetermined surface, and profiling the shape of the rotated component using the line sensor (110).

5 Claims, 13 Drawing Sheets

COMPONENT SHAPE PROFILING METHOD AND COMPONENT MOUNTING METHOD

TECHNICAL FIELD

The present invention relates to a component mounter which mounts components on a board, and in particular to a component mounter which mounts electronic components on a printed board, liquid crystal display panel or the like.

BACKGROUND ART

Conventionally a component mounter has been used in the case of mounting electronic components on a printed board. This component mounter includes a mounting head which is capable of holding an electronic component by vacuum suction and mounting the held electronic component onto a printed board, and an XY robot which is capable of moving the mounting head two-dimensionally.

This component mounter mounts electronic components on a printed board in the following manner. Its mounting head gets a supply of an electronic component from a component supply unit and holds the supplied electronic component. Its XY robot conveys the mounting head, on which the electronic component is suction-held, above the printed board. The mounting head mounts the electronic component onto the printed board.

It is common that electronic components are respectively placed in the storage spaces, of the component supply unit, which are slightly bigger than the electronic components. The positions and angles of the electronic components vary slightly depending on the electronic components. With a purpose of mounting these electronic components on a printed board with high accuracy, the component mounter is configured to: pick up an electronic component using the component supply unit to; profile the shape of the electronic component using a non-contact position profiling unit (a so-called component recognition unit) such as a camera or a line sensor; correct a misalignment of the position or angle of the electronic component in the component supply unit; and mount the electronic component onto a printed board.

A method of profiling the position of a component by projecting a beam of laser light on the component and recognizing the shadows of the electrodes and the component is employed as a non-contact position profiling method for many types of mounters. However, in the case where there is a defective electronic component, for example, an electronic component including an upwardly-rising lead or a chipped or lost ball, it cannot be connected with a printed board correctly. In these days, in order to improve mounting quality further, there has been a demand to inspect components for an upwardly-rising lead and a chipped or lost ball, using a non-contact position profiling unit before the components are mounted.

Therefore, a component mounter is equipped with a line sensor which profiles the shape of an electronic component held by a mounting head three-dimensionally. First, the mounting head gets the electronic component from a component supply unit and holds the supplied electronic component. Subsequently, the line sensor profiles the holding status of the electronic component three-dimensionally and, when necessary, corrects the position of the electronic component before the electronic component is mounted. In addition, in the case where an electronic component has a defect in shape, it is possible to disregard the component using the mounter so that it is not mounted (for example, refer to Patent Reference 1: Japanese Laid-open Patent Application No. 2004-235671).

The line sensor is a device which projects a beam of laser light in a direction vertical to the moving direction of an electronic component held by a mounting head, detects the diffused light reflected on the surfaces of the electronic component by its detector, and profiles the shape of the electronic component three-dimensionally based on the triangulation theory.

There have been conventional line sensors structured to have two detectors which complement each other in the case where no reflected light returns to one of these detectors due to the angle of reflection. However, there are still some cases where the position of an electronic component cannot be corrected, depending on an electronic component. One is the case where the shape of an electronic component cannot be accurately profiled if a line sensor becomes incapable of profiling the shape of a component or if noises are overlapped. For this reason, the height of an electronic component in a generated image becomes unclear and thus it becomes impossible to recognize a misalignment of the electronic component. Another is the case where an acceptable component is judged as a defective component or a defective component is judged as an acceptable component because of an error in profiling the height of the target point on the electronic component, and then mounted.

As a result of a diligent study regarding the above-mentioned problems, the inventors of the present invention have concluded that the following are conceivable reasons of profiling errors made by a line sensor.

1. Here is a case of an electronic component 20 such as a Quard Flat Package (QFP) or a Small Outline Package (SOP) equipped with a lead 11 which is electrically conductive and inclined in an elevation or depression angle direction, as shown in FIG. 1.

As shown in FIG. 2A, in the case where a beam of laser light li is projected by a line sensor in a direction which is approximately vertical to the horizontal surface of the lead 11, the reflected light lo diffuses equally in all directions and reaches a detector 21, and therefore it is possible to perform profiling of the shape of the component within the detectable range of the detector 21. On the other hand, in the case where a lead whose surface is mirror-like and the light li is projected on the horizontal surface of the lead 11 with a slight angle onto the surface, as shown in FIG. 2B, the reflected light lo gathers exclusively to one of the detectors 21 and the amount of light exceeds the detectable range of the detector 21. Additionally, the other detector 21 cannot perform profiling of the shape of the component because the amount of light is insufficient. More specifically, this tendency is more noticeable in a lead such as a metal-covered lead with a high reflection rate.

Note that FIGS. 2A and 2B are FIG. 6 is a section views view of the lead 11 in a light projection direction.

2. As shown in FIG. 3A, the light li projected from the line sensor diffuses equally in all directions in the case where the surface of the lead 11 has a satin-like finish or random scars, and thus there is no problem. On the other hand, in the case where the surface of the lead 11 has stripe-shaped scars which are arrayed in a same direction, most of a beam of laser light reflects in a direction perpendicular to these stripe-shaped scars as shown in FIG. 3B. These stripe-shaped scars are called hairlines, and they are considered to be made in manufacturing processing. In the case where a detector 21 is present on the optical axis of the reflected light, the amount of diffused light increases. However, since the increase is within the detectable range of the detector 21, the height of the component can be obtained accurately. In this case, only a small amount of diffused light reaches in the same direction as these hairlines, as shown in FIG. 3C. Thus, in the case where a detector 21 is present in the same direction as the hairlines, the amount of light which reaches the detector 21 is insufficient. Therefore, it is impossible to perform profiling of the shape of the component, or if possible, the accuracy is bad. Additionally, in some cases, these scars face a particular direction with respect to the electronic component, irrespective of the direction in which the lead 11 extends. Therefore, there may be a case where all the shapes of the components cannot be profiled depending on a direction in which the electronic components are supplied.

Note that each of FIGS. 3A, 3B and 3C is a plan view of a part of the lead 11 when viewed in the light projection direction.

3. Here is FIG. 4A shows another case of an electronic component 20 on which pillar-shaped leads 11 extend in the light projection direction of the light li and which are arrayed tightly like a Ceramic Column Grid Array (CCGA), in other words, in the case where the light projection direction of the light li matches the standing direction of these leads 11 and the heights of the leads which reflect the projection light li are greater than the intervals of the standing intervals of the leads 11. In this case, noises n may be measured between the leads 11 in the sweeping direction (the direction of the arrow in FIG. 4B) of the projection light li and the leads 11 in the vertical direction, as shown in FIG. 4B. This occurs when the intervals of these pillar-shaped leads are reduced to a certain level.

In any cases described above, it is impossible to profile the shapes of electronic components accurately. This makes it impossible to recognize a holding misalignment of an electronic component or an electronic component with an abnormal shape in the image processing to be performed later on. Thus, there required to profile the shapes of the electronic component again, or to abandon performing profiling of the three-dimensional shapes of the components and performing profiling of the two-dimensional shapes of the components instead.

The present invention has been conceived considering the above-described problems. An object of the present invention is to recognize a component three-dimensionally irrespective of whether leads of the component are in the above-described state, by using a simple method for preventing a profiling error which occurs in any of these three cases.

DISCLOSURE OF INVENTION

In order to achieve the above object, the method for profiling the shape of a component, in the present invention, uses a line sensor which is provided in a component mounter and which profiles, three-dimensionally, the shape of the component held by a mounting head by (a) projecting a sweeping light onto the component in a relative movement between the line sensor and the component so that the sweeping light traverses a direction of the movement and (b) detecting a reflected light from the component using a detector. The method for profiling a shape of a component includes: rotating the component by a predetermined angle on a predetermined surface after the mounting head gets the component from a component supply unit and holds the component; and profiling the shape of the rotated component using the line sensor.

Profiling the shapes of components in this way makes it possible to avoid profiling errors, by a line sensor, which occur depending on the shapes and characteristics of the components, and to profile the shapes of various types of components suitably.

In addition, in the rotation of the components, it is desirable that the component be rotated so that the amount of the reflected light from the component is within the detectable range of the detector, and the predetermined angle be selected from among angles ranging from 30 to 60 degrees inclusive.

Selecting a rotation angle within the range makes it possible to avoid profiling errors of more many types of components in a general manner.

Further, the method of profiling the shape of the component may include detecting an error in profiling the shape of a component by the line sensor and rotating the component using the component rotation unit 211 in the case where a profiling error is detected.

This makes it possible to eliminate an unnecessary rotation of a component and thus to improve the productivity.

Note that it is possible to achieve the above object in forms of: a program which causes a computer to execute these actions; an apparatus including units corresponding to these actions; and a method including these actions.

With the present invention, it becomes possible to profile the shapes of components without allowing any profiling error to be made, irrespective of the states and shapes of the components.

FURTHER INFORMATION ABOUT TECHNICAL BACKGROUND TO THIS APPLICATION

The disclosure of Japanese Patent Application No. 2005-96149 filed on Mar. 29, 2005 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings.

DETAILED DESCRIPTION OF BEST MODE FOR CARRYING OUT THE INVENTION

Next a first embodiment of the present invention will be described with reference figures.

Figure 1:
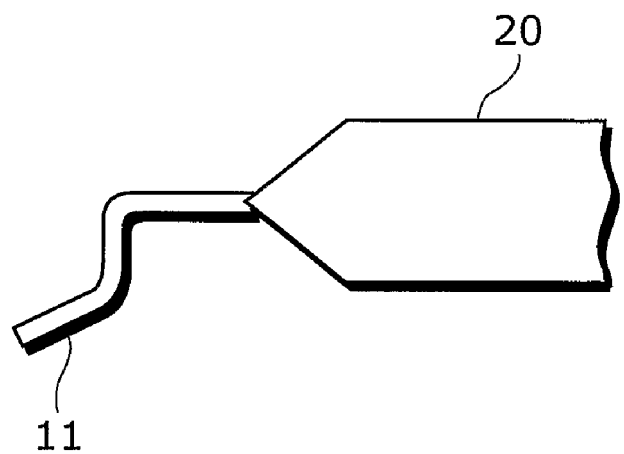
FIG. 1 is a schematic side view showing the state of the lead of an electronic component.
Figure 2A:
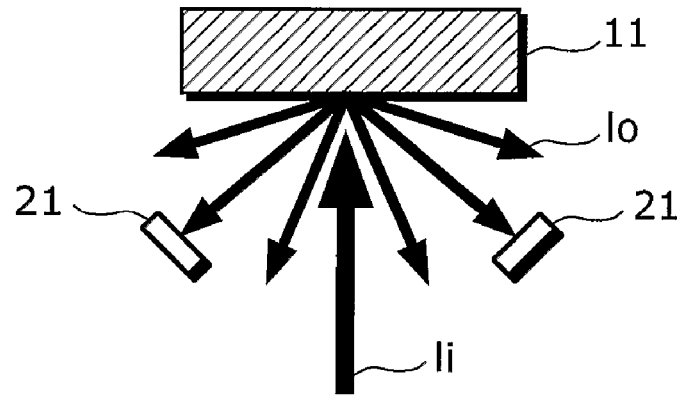
FIG. 2A is a schematic diagram showing the state of diffused light in the case where the lead is parallel to the horizontal surface of the electronic component.
Figure 2B:
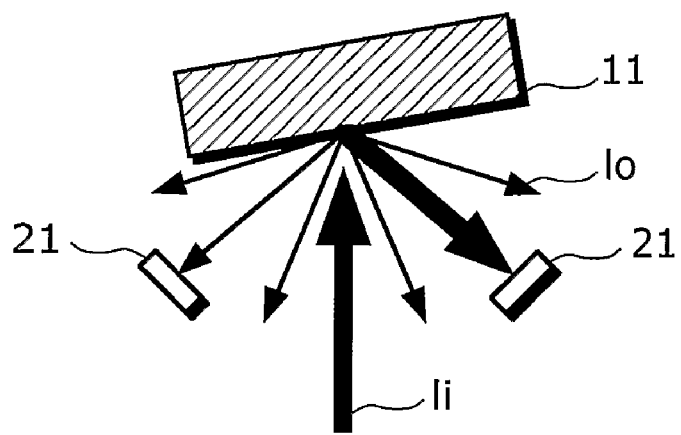
FIG. 2B is a schematic diagram showing the states of the light reflected and diffused on the lead in the case where the lead is inclined with respect to the horizontal surface.
Figure 3A:
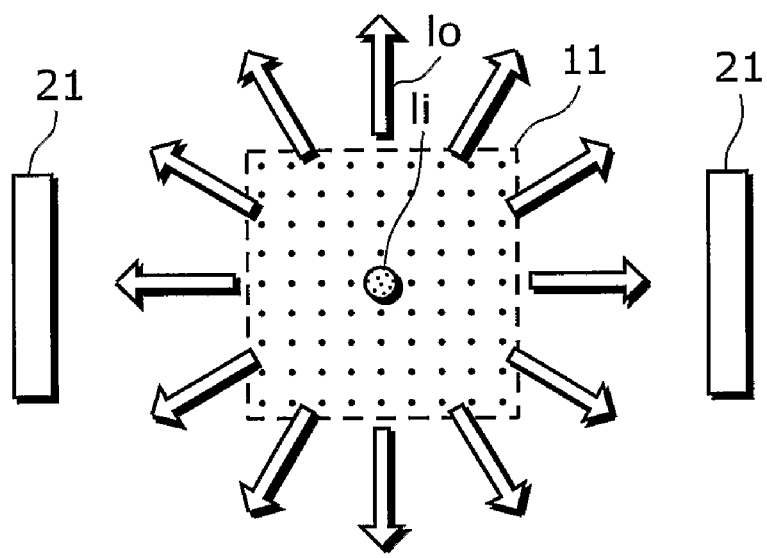
FIG. 3A is a schematic diagram showing the states of the light reflected and diffused on the lead whose surface does not include any hairline-like scars.
Figure 3B:
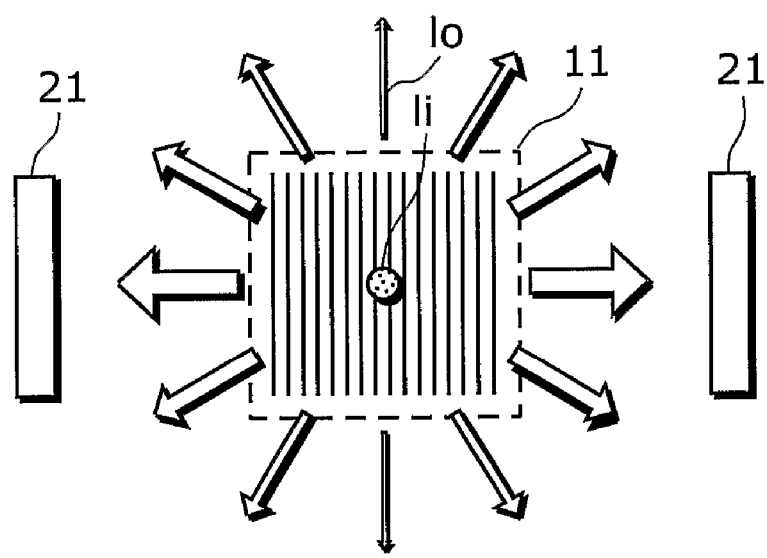
FIGS. 3B and 3C each is a schematic diagram showing the states of the light reflected and diffused on the lead whose surface includes hairline-like scars.
Figure 3C:
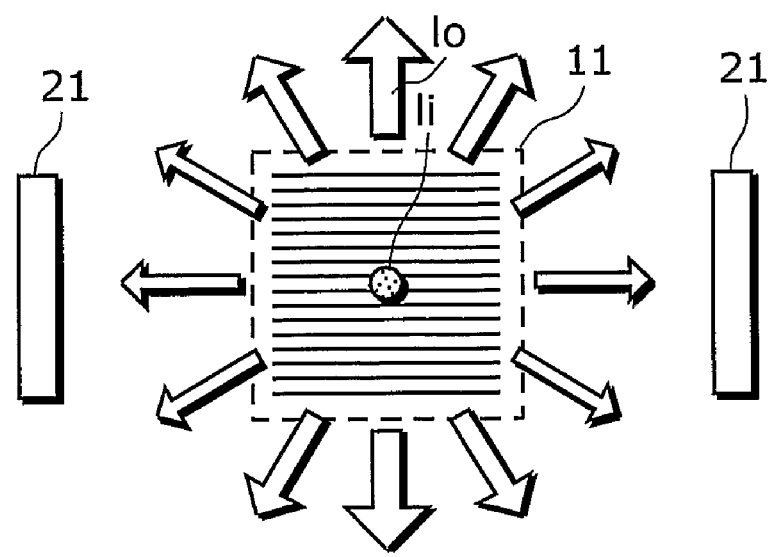
Figure 4A:
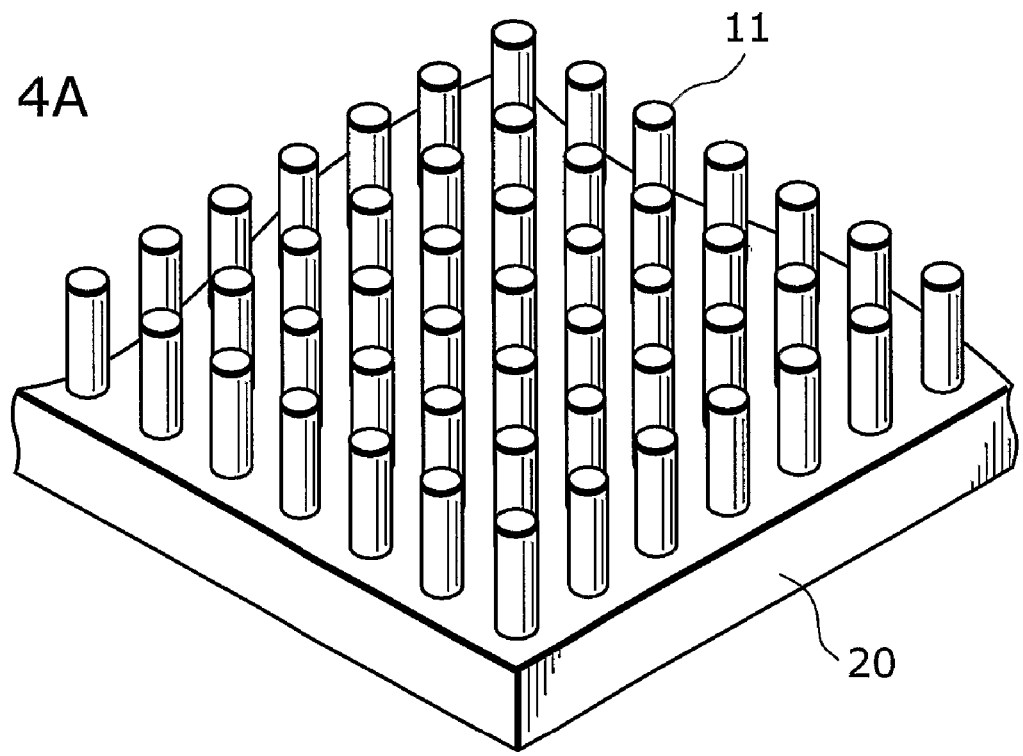
FIG. 4A is a perspective view schematically showing the shape of a particular electronic component.
Figure 4B:
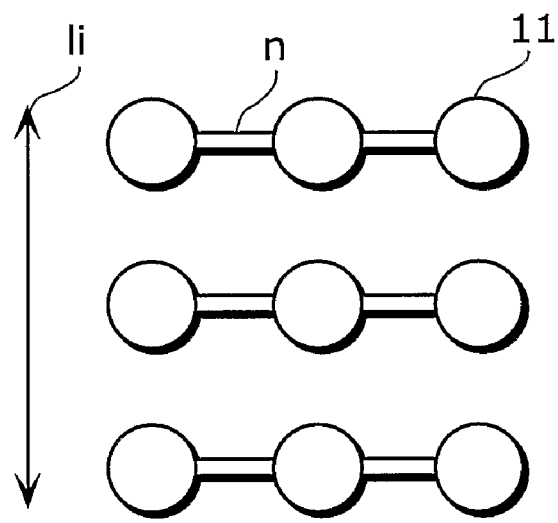
FIG. 4B is a diagram schematically showing the state of noises.
Figure 5:
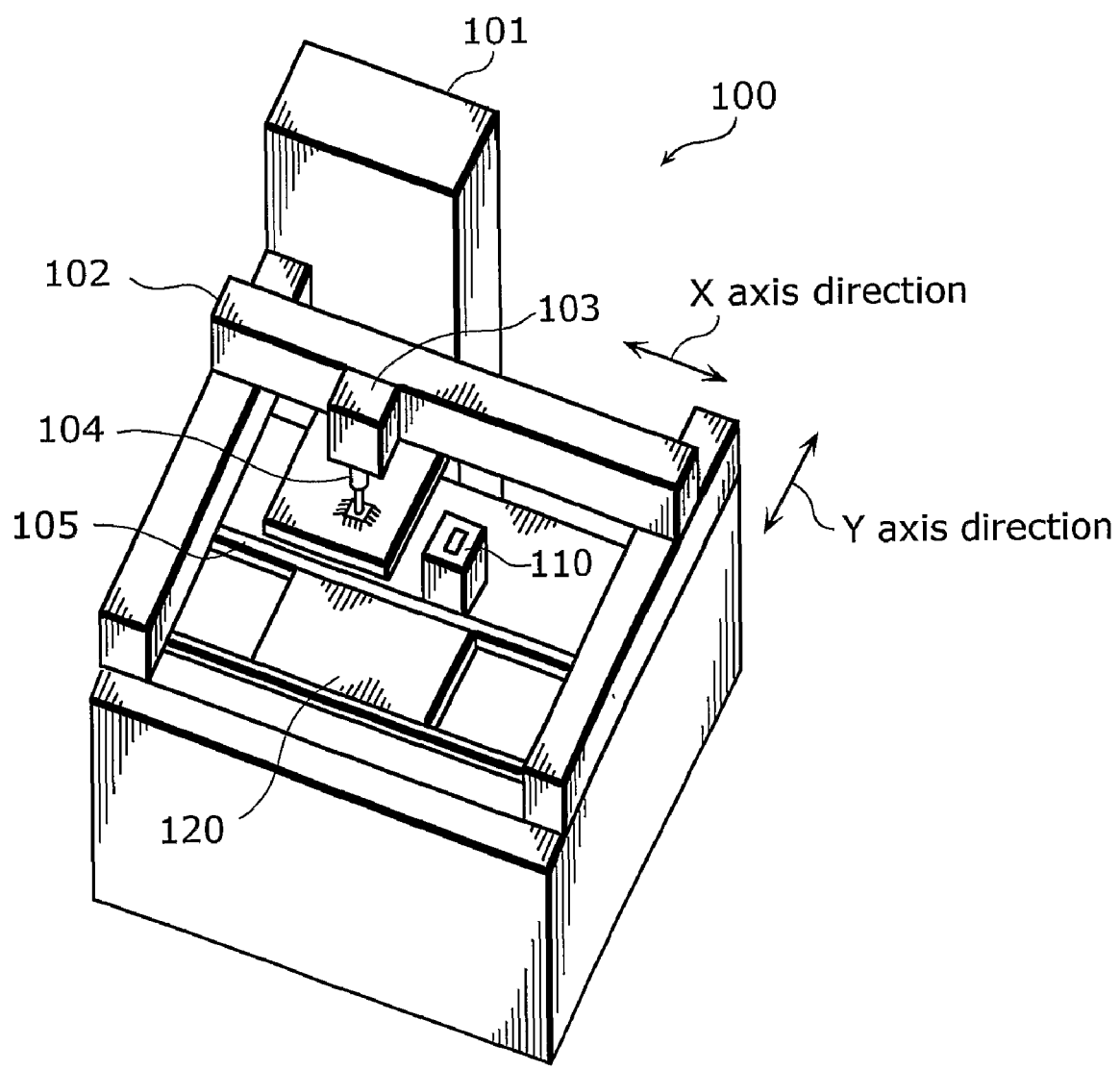
FIG. 5 is a perspective view schematically showing the appearance of a component mounter of the present invention.

FIG. 5 is a perspective view schematically showing the appearance of a component mounter 100 of the present invention.

As shown in the figure, the component mounter 100 is intended for mounting electronic components onto a board 120, and includes: a component supply unit 101, a beam 102, a mounting head 103 including a holding nozzle 104, a conveying unit 105 and line sensor 110.

The component supply unit 101 holds an electronic component to be mounted and supplies the electronic component as a need arises. In this embodiment, electronic components with a same performance are placed on a tray, and it is possible to supply plural types of electronic components by exchanging trays.

The beam 102 is structured to extend in the X axis direction of the component mounter 100 and is movable in the Y direction. The beam 102 and the mounting head 103 to be attached to the beam 102 in a movable manner make up an XY robot.

Since the mounting head 103 is attached to the beam 102 in a movable manner as mentioned above, the mounting head can hold an electronic component and mount it onto the board 120 by vertically moving the holding nozzle 104.

The conveying unit 105 has a belt conveyer. With the belt conveyer, the conveying unit 105 can receive a board 120 conveyed from the upstream of the mounting line, convey the board 120 to the region where the mounting head 103 can mount the electronic component onto the board 120, and convey the board with electronic components to the mounting line.

Note that the line sensor 110 will be described in detail later on.

Figure 6:
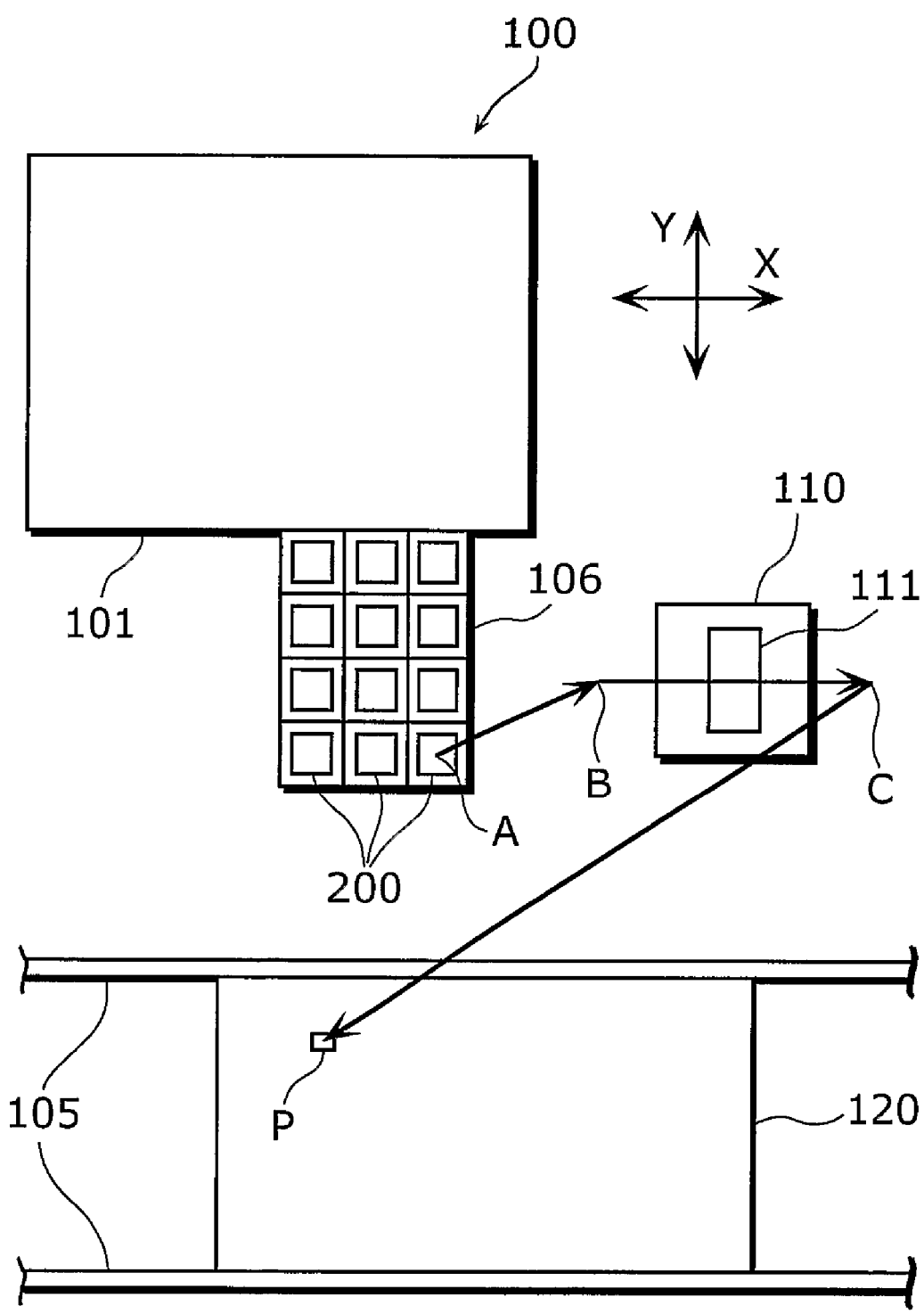
FIG. 6 is a plane view showing inside the component mounter.

FIG. 6 is a plane view showing the principal part of the component mounter 100.

As shown in the figure, electronic components 200 are placed on a tray 106 included in the component supply unit 101. First, the electronic component 200 is vacuum-suctioned by the holding nozzle 104 of the mounting head 103 (not shown) and moves according to the upward movement of the holding nozzle 104 at Point A in the figure, and is conveyed to Point B. Next, while it is conveyed to Point C along with the X axis, the shape of the electronic component 200 is profiled by the line sensor 110 so as to correct a holding misalignment, an angle misalignment or the like. Subsequently, the electronic component 200 is conveyed to Point P and mounted at this mounting point.

Note that the line sensor 110 has a window 111 which allows passage of (a) a beam of laser light sweeping along with the Y axis, for profiling the shape of the component, and (b) the reflected light of the beam reflected on the surface of the electronic component 200.

Figure 7:
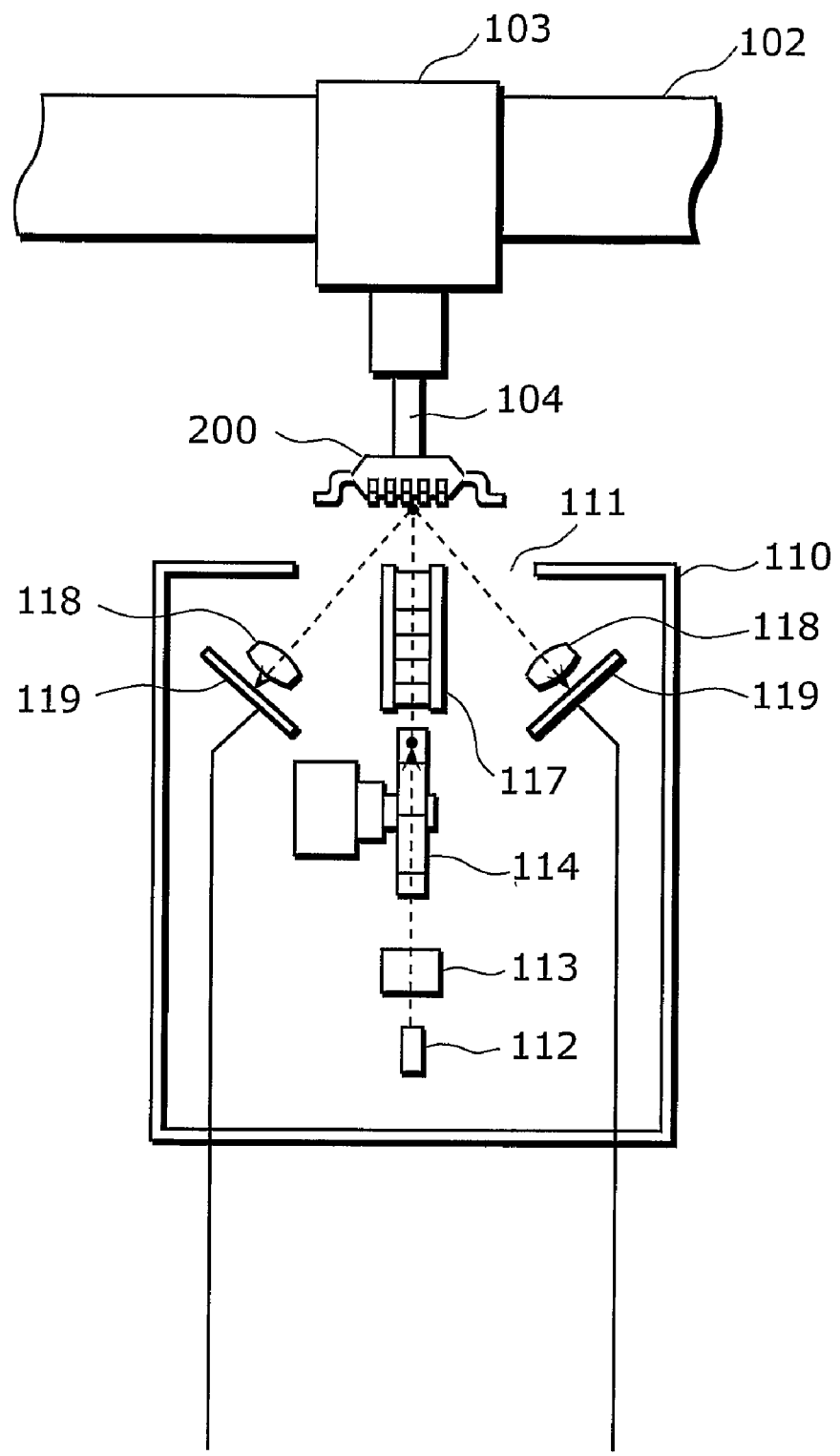
FIG. 7 is a side perspective view of the enclosure of the line sensor when viewed in the X axis direction.

FIG. 7 is a side perspective view of the enclosure of the line sensor 110 when viewed in the X direction.

Figure 8:
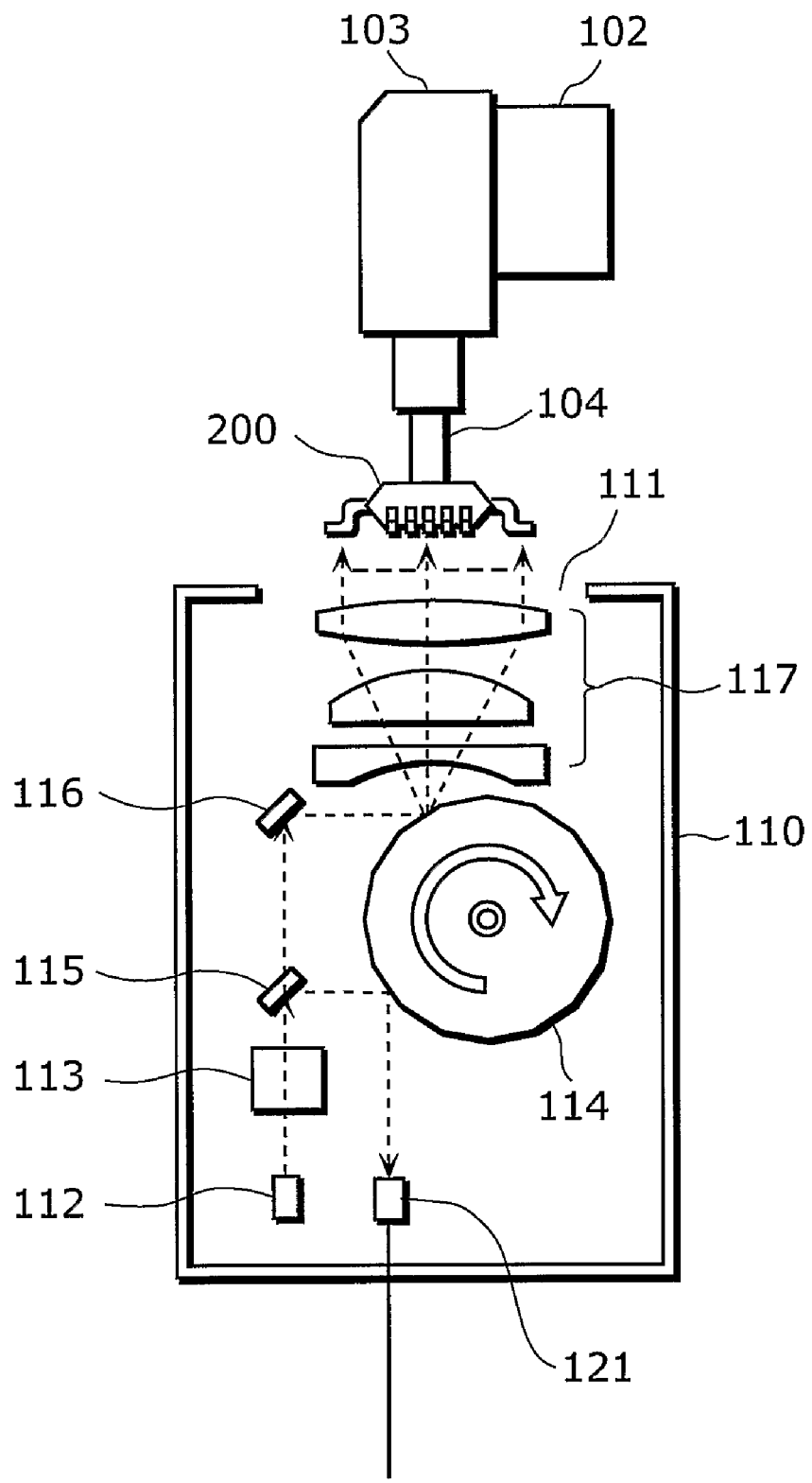
FIG. 8 is a side perspective view of the enclosure of the line sensor when viewed in the Y axis direction.

FIG. 8 is a side perspective view of the enclosure of the line sensor 110 when viewed in the Y direction.

The line sensor 110 is intended for projecting a sweeping light onto the electronic component 200 in the Y direction so as to profile the shape of a component by measuring the diffused light. The line sensor 110 includes: a laser projection unit 112, a light condensing and shaping lens 113 which condenses and shapes this laser beam, a polygon mirror 114 which allows sweeping of the laser beam reflected on this mirror by a mechanical rotation, a half mirror 115 which allows passage of a part of the laser beam and reflection of the remaining part of the laser beam, a total reflection mirror 116 which reflects the whole light, and a group of lens for vertical projection which vertically projects the beam of laser light diffused by the polygon mirror 114 at a constant velocity.

The line sensor 110 further includes two sets of an image forming lens 118 and a semiconductor position sensitive detector (hereinafter abbreviated as PSD) 119. The image forming lens 118 allows image formation of the diffused light of the beam of laser light reached the electronic component 200. The PSD is a detector with a function of generating an electric signal which correlates to the point where the diffused light of the beam of laser light reached the electronic component 200 forms an image after passing through the image forming lens 118.

These PSDs 119 are positioned at adjacent areas of the polygon mirror 114 so that the vertical surfaces of the PSDs 119 face the light-projected part of the electronic component 200 at a diagonally upward angle, and that the horizontal surfaces of the PSDs 119 are oriented vertically (in the X direction) with respect to the laser beam sweeping direction (the Y direction) to be mentioned later on. In addition, these PSDs 119 are set to be capable of detecting a comparatively weak light which has been obtained as a result that the image forming lens 118 condensed the diffused light of the beam of laser light diffused on the surfaces of the electronic component 200.

Here, the beam of laser light projected by the laser projection unit 112 is condensed and shaped by the light condensing and shaping lens 113, passes through the half mirror 115, reflects on the total reflection mirror 116, and reaches the polygon mirror 114. The polygon mirror 114 is rotating at a constant velocity, and thus a sector sweep of the laser beam reached the mirror surface of the polygon mirror 114 is performed. Further, the beam of laser light whose optical path is conversed by the group of lens for vertical projection 117 is swept horizontally and thus projected vertically on the electronic component 200. This reflected light (diffused light) which has passed through the image forming lens 118 is formed into an image by these PSDs 119. These PSDs 119 generate output signals for profiling the height of the laser reflection surface of the electronic component 200.

Note that, in FIG. 8, the optical sensor 121 placed adjacent to the laser projection unit 112 is intended for detecting that the angle of a mirror surface of the polygon mirror 114 changed into a predetermined angle, in other words, for generating an origin signal (a plane origin) of each surface of the polygon mirror 114.

The line sensor 110 in the embodiment receives reflected light using two PDSs 119. This is because a beam of laser light which reflected on a component may not return to a PSD 119 depending on a reflection angle, in the case of using only a single PSD 119. The principal purpose for setting two PDSs is to cause them to complement each other. Setting three or more PDSs may be more effective, but this case is technically the same as the earlier-mentioned case.

Here, an example method profiling the height of the top surface of the electronic component 200 to be profiled by the PSDs 119 will be described with reference to FIG. 9.

Figure 9:
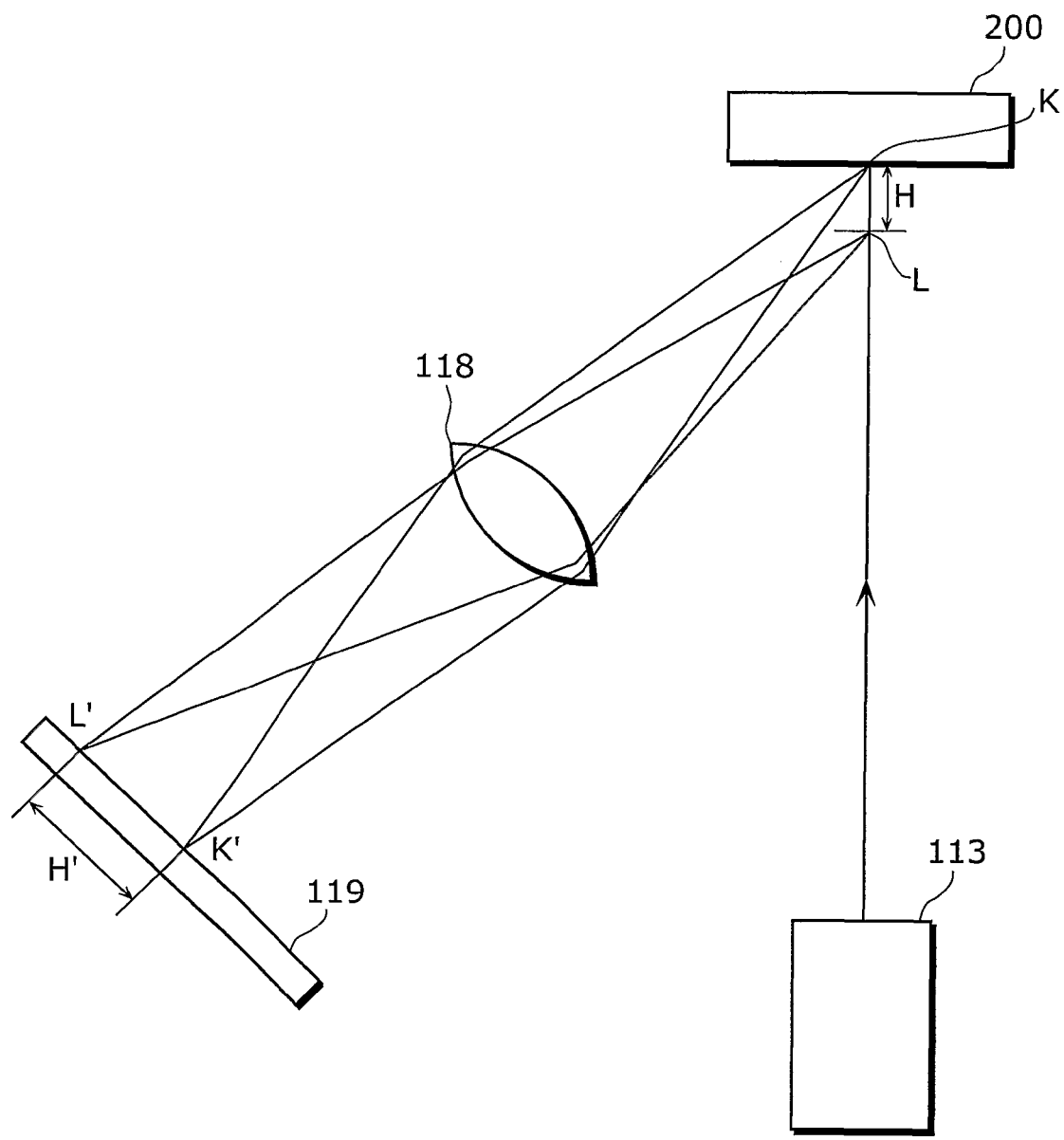
FIG. 9 is a diagram for illustrating the profiling principle of the height of the line sensor.

FIG. 9 is a diagram showing both the following cases together: the case where a beam of laser light is reflected on the bottom surface of an electronic component 200; and the case where a beam of laser light is reflected on the Point L (whose position is lower than the position of Point H) which is distant by H from the Point K on the bottom surface of the electronic component 200.

In the figure, the beam of laser light projected by sweeping on the electronic component 200 diffuses from the electronic component 200. In this case, the beam of laser light diffuses from the above-mentioned Point K and Point L also.

The diffused laser beams are condensed by the image forming lens 118 respectively, and each condensed beam of laser light forms an image on the corresponding PSD 119. In this case, one of the images is formed at Point K' corresponding to Point K, and the other is formed at Point L' which corresponds to Point L and which is distant from Point K' by H'. Since an electromotive force is generated on each image formation point, the PSD 119 can calculate Point H' based on this voltage.

It is possible to obtain the Height H using a known optical distance, based on the Height H' of the top surface of the PSD 119 obtained in this way. Here, in the case where the amount of light on the image formation point is too much, too much electromotive force is generated, and thus it becomes impossible for the PSD 119 to profile Point H'. In contrast, in the case where the amount of light on the image formation point is too small, the electromotive force of the PSD 119 becomes too much, and thus it becomes difficult for the PSD 119 to profile Point H' accurately.

Figure 10:
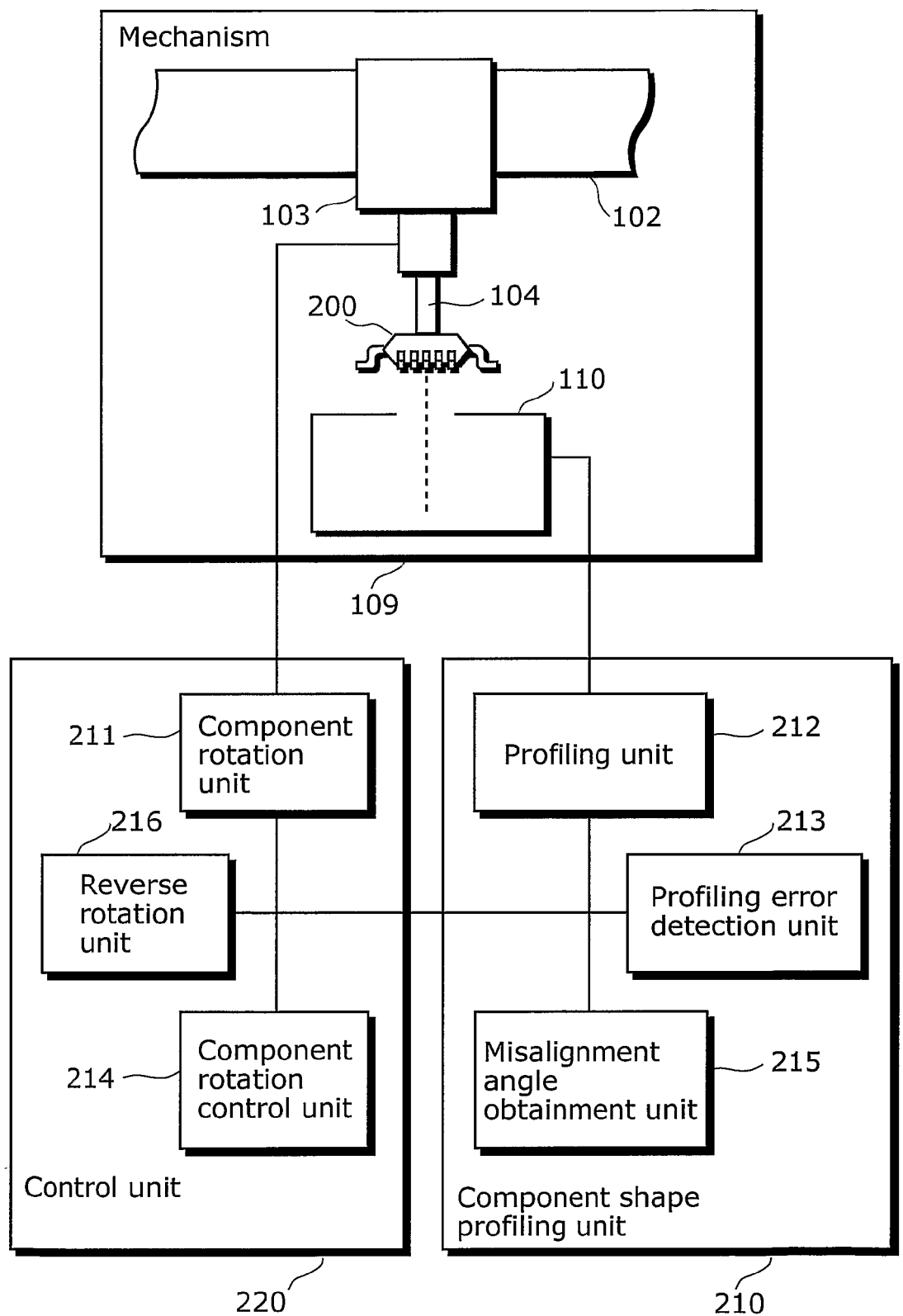
FIG. 10 is a block diagram showing the functional structure and the mechanism of the component mounter of the present invention.

FIG. 10 is a block diagram showing the functional structure and the mechanism of the component mounter 100 of this embodiment.

The component mounter 100 includes: a mechanism 109 having the beam 102, the mounting head 103, and the holding nozzle 104 which are described earlier; a component shape profiling unit 210; and a control unit 220.

The component shape profiling unit 210 is intended for profiling the shape and the holding position of the electronic component 200, and further includes a profiling unit 212, a profiling error detection unit 213 and a misalignment angle obtainment unit 215.

The profiling unit 212 is intended for calculating the value indicating the height of the electronic component 200 by analyzing the signal from the line sensor 110, calculating the value indicating the position data of the horizontal surface (XY surface) based on the data (Y direction) relating to the projection position of the beam of laser light projected from the line sensor 11 and the data (X direction) relating to the position of the mounting head 103, and forming a three-dimensional image based on these values.

The profiling error detection unit 213 is intended for detecting whether the value indicating the height obtained by the profiling unit 212 is abnormal or not. For example, the profiling error detection unit 213 judges that profiling was an error in the following cases: the case where the profiling data of the shapes of the electronic components is compared with the previously stored data relating to the shapes of the respective electronic components to be mounted (for example the heights of the components), and the result showed that the profiling data was different from the stored data; or the case where the light amount of a PSD 119 exceeds the detectable range value.

The misalignment angle obtainment unit 215 is intended for obtaining a misalignment angle of a horizontal surface of an electronic component 200 held by the mounting head 103 based on the data from the profiling unit 212. This misalignment angle is calculated by, for example, detecting how much the image of the profiled electronic component 200 is rotated with regard to the reference image of the electronic component 200.

In addition, the control unit 220 is intended for functioning as a mounting unit by controlling the mechanism 109 based on the profiling result by the component profiling unit 210. The control unit 220 includes a component rotation unit 211, a component rotation control unit 214, and a reverse rotation unit 216.

The component rotation unit 211 is intended for controlling the mounting head 103 which gets an electronic component 200 from the component supply unit 101 and holding the electronic component 200, and rotating the electronic component within the horizontal surface so that the light reflected on it falls within the detection sensitivity range of the PSD 119.

The component rotation control unit 214 is intended for allowing the component rotation unit 211 to rotate a component only in the case where the profiling error detection unit 213 detected a profiling error. Note that whether causing the component rotation control unit 214 to allow the component rotation unit 211 to rotate a component can be arbitrarily profiled, and in the case of not causing the component rotation control unit 214 to do this, the component rotation unit 211 always executes this processing.

The reverse rotation unit 216 is intended for holding the rotation angle of the electronic component 200 with respect to the mounting head 103 at the time when the component rotation unit 211 rotated the electronic component 200, and rotating the electronic component 200 in the reverse direction, based on the correction angle obtained by adding (a) the misalignment angle obtained by the misalignment angle obtainment unit 215 to (b) the rotation angle, after the line sensor 110 finished profiling the shape of the electronic component 200.

Next, the processing operation of the component mounter 100 will be described.

Figure 11:
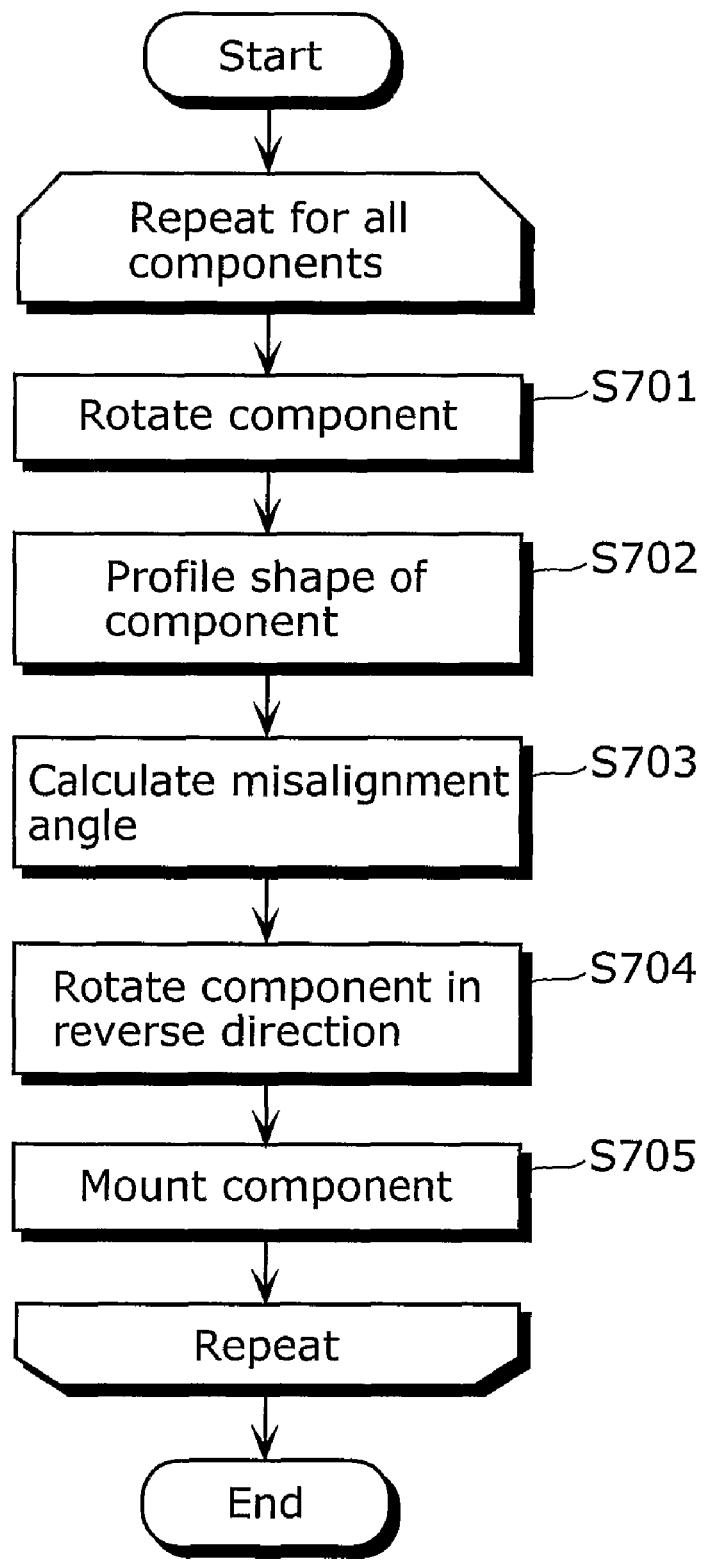
FIG. 11 is a flow chart showing the processing operation of the component mounter.

FIG. 11 is a flow chart showing the processing operation of the component mounter 100.

Figure 12:
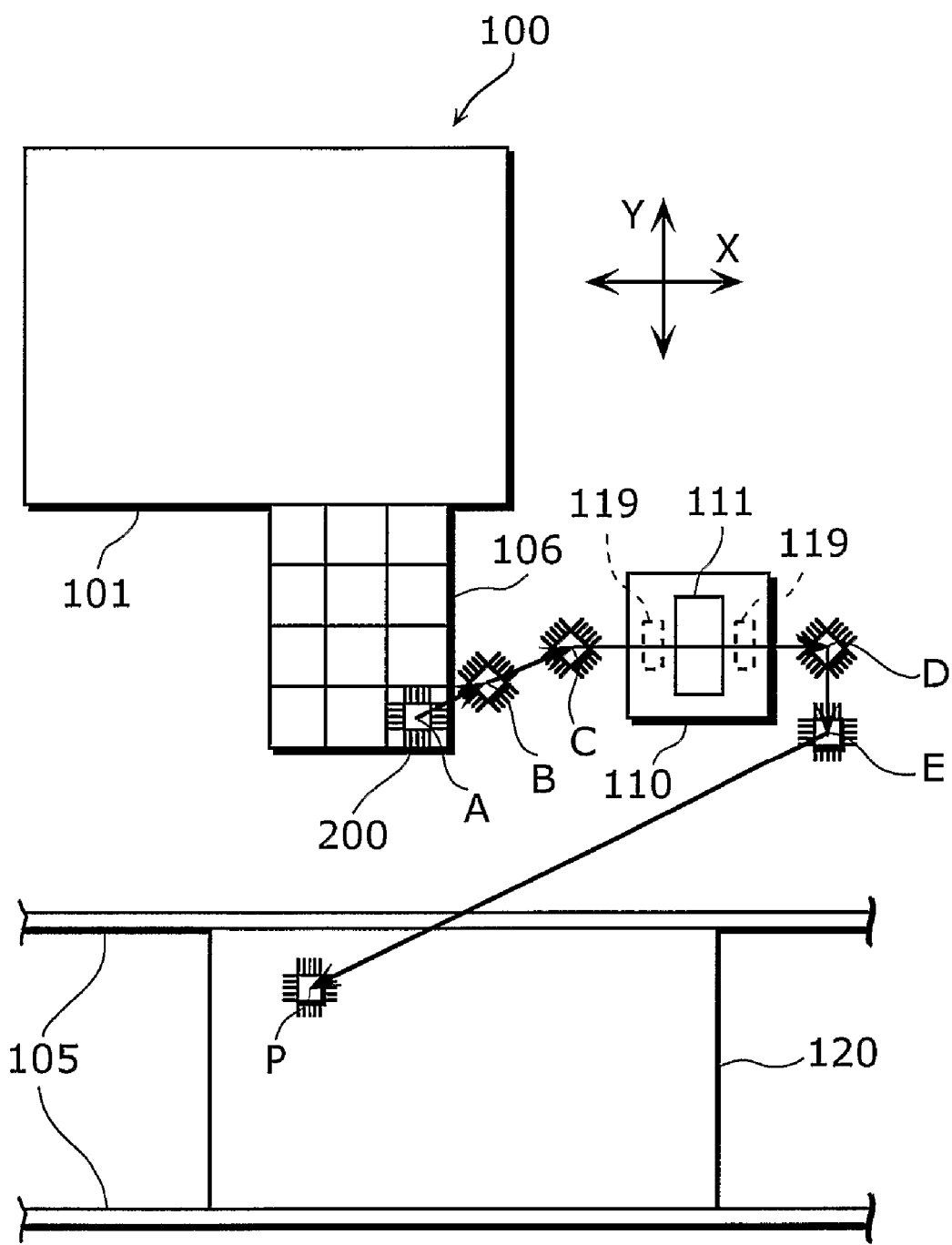
FIG. 12 is a plane view showing the operation state of the component mounter.

FIG. 12 is a plane view showing the operation state of the component mounter 100.

After the mounting head 103 got the electronic component from the component supply unit 101 and held it (A in FIG. 12), the component rotation unit 211 rotates the electronic component 200 by 45 degrees (S701)(B in FIG. 12). Point A and Point B are shown at different places in FIG. 12, but it should be noted that the electronic component 200 may be rotated immediately above the Point A. In addition, it is possible to judge the type of the held electronic component 200 with reference to the component data and rotate it only in the case where it needs to be rotated.

In addition, the rotation angle of the electronic component 200 may be selected from among angles ranging from 30 to 60 degrees inclusive. This is required because it is impossible to handle plural types of electronic components 200 in a general manner in the case where a rotation angle is selected deviating from the range. Note that this description is not intended for forbidding to change a rotation angle depending on the type of an electronic component 200. A good result may be obtained in the case where the rotation angle is changed deviating from the range, depending on the type of an electronic component 200. If so, the use of the angle is not forbidden by the description.

Figure 13:
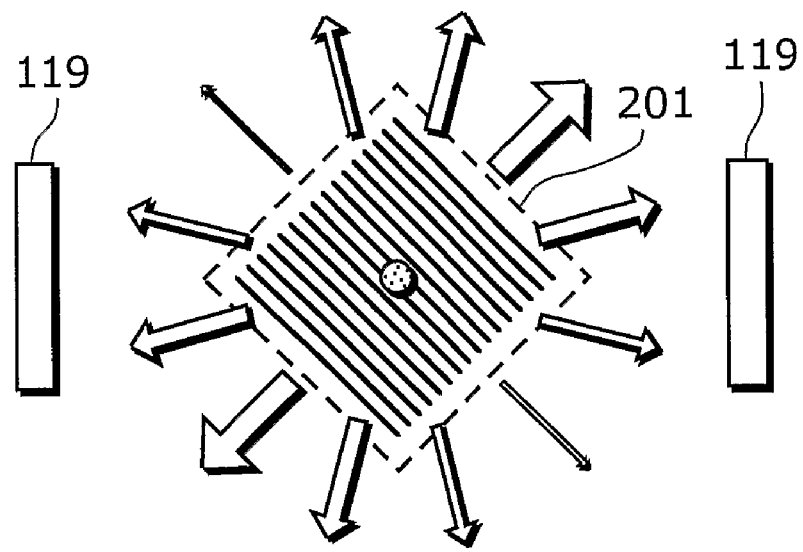
FIG. 13 is a diagram schematically showing the relationship between a detector and the light which reflects and diffuses on the surface of the lead.

After the electronic component 200 is conveyed to the proximity of the line sensor 110 (C in FIG. 12), the electronic component 200 with the rotation angle (45 degrees) is subject to the sweeping by the line sensor 110 (C to D in FIG. 13). During the sweeping, the profiling unit 212 profiles the electronic component 200 (S702).

In this way, when the line sensor 110 profiles the electronic component 200 in a state where the electronic component 200 maintains a certain angle with respect to PSDs 119, it is possible to suppress an occurrence of a profiling error. Note that the effect will be described later on.

Next, the misalignment angle obtainment unit 215 obtains a misalignment angle based on the image of the electronic component 200 generated by the profiling unit 212 (S703).

Next, the reverse rotation unit 216 controls the mounting head 103 to rotate the electronic component 200 in the reverse direction, based on the correction angle obtained by adding (a) the misalignment angle obtained by the misalignment angle obtainment unit 215 to (b) the rotation angle of the electronic component 200 rotated by the component rotation unit 211 (S704)(E in FIG. 12).

Note that this reverse rotation is unnecessary for an electronic component 200 which did not need to be rotated and thus was not rotated. Of course, only the misalignment angle obtained by the misalignment angle obtainment unit 215 is corrected.

Next, the electronic component 200 is conveyed to the mounting point P and mounted onto the board 120 (S705) The above-described steps S701 to S705 are repeated for all the electronic components 200 to be mounted.

Realizing a structure like this and executing processing like this makes it possible to obtain the following effects.

1. Even in the case where an electronic component 200 includes a lead inclined in an elevation or depression direction, the most intensive reflected light of a beam of laser light projected from the line sensor 110 moves in the horizontal direction by 45 degrees starting with the point shown in FIG. 13 and deviates from the detectable range of the PSDs 119. Therefore, it becomes possible to prevent the reflected light from directly reaching the PSDs 119 and also prevents the amount of light from exceeding the detectable range of the PSDs.

2. FIG. 13 shows the case where so-called hairlines are present on the surface of the lead 201. Even in this case, since there is no PSD 119 in the direction in which diffused light is the smallest, it becomes possible to obtain light which is sufficient for profiling. Thus, it is possible to prevent a profiling error.

Figure 14:
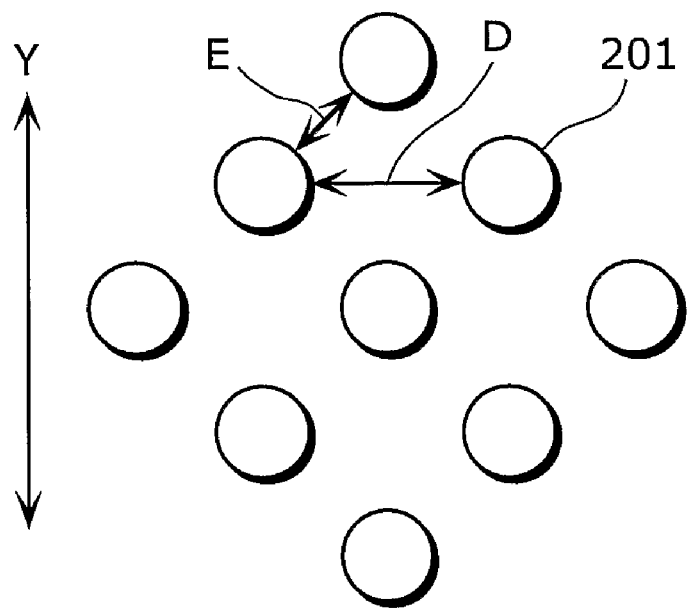
FIG. 14 is a diagram schematically showing the relationship between the lead of the electronic component and a light sweeping direction of the line sensor.

3. As shown in FIG. 14, Intervals D between leads 201 in the direction vertical to the sweeping direction (Y direction) of the line sensor 110 are wider than the Minimum intervals E between leads 201. Therefore, it becomes possible to suppress noises which occur in both the sweeping direction and vertical direction.

Next, a second embodiment of the present invention will be described with reference to figures. Note that, since the structure and functions of the mounter are the same as the ones in the first embodiment, they will not be described here again, but the processing operation will be described.

In addition, the following description will be made with reference to FIG. 12.

Figure 15:
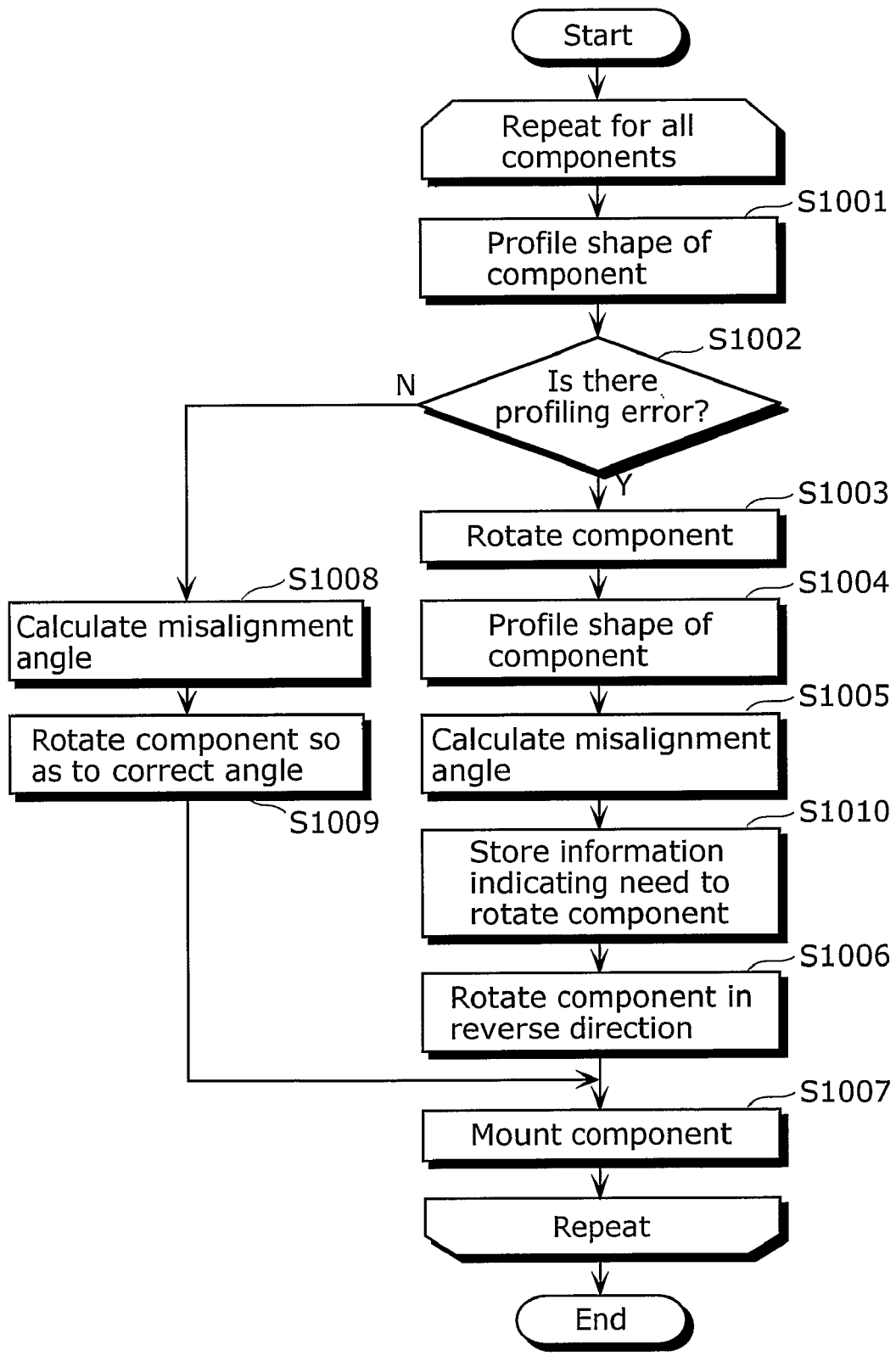
FIG. 15 is a flow chart showing the processing operation of the component mounter of a second embodiment of the present invention.

FIG. 15 is a flow chart showing the processing operation of the component mounter 100 of the present invention.

First, the mounting head 103 gets an electronic component 200 from the component supply unit 101 and holds it (A in FIG. 12), and conveys it to Point C maintaining the angle of the held electronic component 200. The line sensor 110 is subjected to sweeping by the electronic component 200 which is held by the mounting head 103 at the angle (C to D in FIG. 12). The profiling unit 212 profiles the electronic component 200 (S1001).

Next, the profiling error detection unit 213 judges whether or not the data obtained by the profiling unit 212 indicates a profiling error (S1002).

In the case where the profiling error detection unit 213 judges that the data indicates a profiling error (NO in S1002), the misalignment angle obtainment unit 215 obtains the misalignment angle based on the image of the electronic component 200 generated by the profiling unit 212 (S1008), rotates the electronic component 200 so as to correct its angle based on the misalignment angle (S1009), and mounts it onto the board 120 (S1007).

In other case where the profiling error detection unit 213 judges that the data does not indicate a profiling error (YES in S1002), the component rotation unit 211 rotates the electronic component 200 by 45 degrees starting from the angle at which the electronic component 200 is held (S1003). After the electronic component 200 is conveyed to Point C again, the electronic component 200 is subjected to sweeping by the line sensor 110 at the angle (C to D in FIG. 12), and the electronic component 200 is profiled (S1004).

Next, the misalignment angle obtainment unit 215 obtains the misalignment angle based on the image of the electronic component 200 generated by the profiling unit 212 (S1005). Subsequently, the electronic component 200 stores data as to whether each type of electronic components 200 needs to be rotated or not (S1010). After this step, it is possible to judge the need for rotation based on the stored data relating to each type of electronic components 200.

The reverse rotation unit 216 controls the mounting head 103 to rotate the electronic component 200 in the reverse direction, based on the correction angle obtained by adding (a) the misalignment angle obtained by the misalignment angle obtainment unit 215 to (b) an angle of 45 degrees by which the component rotation unit 211 has rotated the electronic component 200 (S1006)(E in FIG. 12).

Next, the electronic component 200 is conveyed to Point P, and mounted onto the board 120 (S1007).

The above-described steps S1001 to S1009 will be repeated on all the electronic components 200 to be mounted.

Employing a processing operation like this makes it possible to correctly profile the necessity of rotation of a component as to which the necessity for rotation is unknown. In addition, it becomes possible to reduce the time for mounting all the electronic components 200 onto a board because some electronic components 200 can be profiled correctly by the line sensor 110 without being rotated before profiling, and thus no reverse rotation after the profiling is required for these electronic components 200.

In the above embodiment, the electronic components 200 are rotated before the line sensor 110 profiles the electronic components 200, and then they are rotated reversely. However, it should be noted that this description is not intended for forbidding to rotate the electronic component 200 to the angle which matches the angle of a board without reversely rotating electronic component 200 which has been profiled. In other words, depending on a type of the electronic component 200 or a board onto which the electronic component 200 is mounted, the electronic component 200 gotten from the component supply unit 101 may need to be rotated at a predetermined angle (for example, 90 degrees) before being mounted. In this case, it is good that the electronic component 200 is rotated by 45 degrees before being subjected to sweeping above the line sensor 110, and that, after the profiling of the electronic component 200, it is rotated by 45 degrees taking into account the rotation misalignment.

The above-described embodiments describe the component mounter 100 whose mounting head 103 holds an electronic component 200 and mounts it onto a board. However, it should be noted that the present invention is not limited to this, and the component mounter may be equipped with a multi-mounting head which is capable of holding plural electronic components at the same time.

In addition, in those two embodiments, the electronic component 200 is rotated with respect to the line sensor 11. However, it is of course possible to rotate only a PSD 119 without rotating the held electronic component 200, or to place the PSD 119 or the line sensor 110 itself at a rotated diagonal position.

In addition, it is assumed that the line sensor 110 is fixed, and the electronic component 200 is moved. However, it is not limited to this, and the line sensor 110 may move toward the electronic component 200 and profile the shape of the electronic component.

In addition, this embodiment shows an example of a lead, but the lead used here conceptually belongs to an electrode. Therefore, electrodes having any shapes such as hemisphere-shaped electrodes may be included in the present invention.

Although only exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a component mounter which mounts components onto a board, and in particular to a component mounter which mounts electronic components onto a printed board.

The invention claimed is:

1. A method for profiling a shape of a component using a line sensor which is provided in a component mounter and which profiles, three-dimensionally, the shape of the component held by a mounting head by (a) projecting a sweeping light onto the component in a relative movement between the line sensor and the component so that the sweeping light traverses a direction of the movement and (b) detecting a reflected light from the component using a detector, said method comprising:

profiling the shape of the component maintaining a positional relationship between the component and the detector, so that an amount of the reflected light from the component is within a detectable range of the detector; and rotating the component by a predetermined angle so that the positional relationship is achieved, said rotating being performed after the mounting head gets the component from a component supply unit and holds the component.

2. The method for profiling a shape of a component according to claim 1, wherein the predetermined angle is selected from among angles ranging from 30 to 60 degrees inclusive.

3. The method for profiling a shape of a component according to claim 1, said method further comprising:

detecting a profiling error made by the line sensor; and controlling said rotating of the component so that the component is rotated, in the case where a profiling error is detected.

4. The method for profiling a shape of a component according to claim 3, said method further comprising obtaining a type of the rotated component and storing information indicating that the component of the type needs to be rotated, in the case where said rotating of the component is executed by said controlling.

5. The method for profiling a shape of a component according to claim 1, said method further comprising:

obtaining the information indicating that the component held by the mounting head needs to be rotated; and controlling said rotating of the component so that the component is rotated, based on the information obtained in said obtaining.

* * * * *

UNITED STATES PATENT AND TRADEMARK OFFICE
CERTIFICATE OF CORRECTION

| | | |
|---|---|---|
| PATENT NO. | : 7,843,573 B2 | Page 1 of 1 |
| APPLICATION NO. | : 11/667312 | |
| DATED | : November 30, 2010 | |
| INVENTOR(S) | : Junichi Hada et al. | |

It is certified that error appears in the above-identified patent and that said Letters Patent is hereby corrected as shown below:

On the Title Page

In Item (86), "PCT No.: PCT/JP2006/004827" should read --PCT No.: PCT/JP2006/304827--.

Signed and Sealed this
Fifteenth Day of March, 2011

David J. Kappos
*Director of the United States Patent and Trademark Office*